(12) United States Patent
Chen et al.

(10) Patent No.: US 11,856,733 B2
(45) Date of Patent: Dec. 26, 2023

(54) COLD PLATE

(71) Applicant: AURAS TECHNOLOGY CO., LTD., New Taipei (TW)

(72) Inventors: Chien-An Chen, New Taipei (TW); Chien-Yu Chen, New Taipei (TW); Yu-Jie Liu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 452 days.

(21) Appl. No.: 16/899,742

(22) Filed: Jun. 12, 2020

(65) Prior Publication Data

US 2020/0396866 A1     Dec. 17, 2020

Related U.S. Application Data

(60) Provisional application No. 62/860,285, filed on Jun. 12, 2019.

(51) Int. Cl.
*H05K 7/20* (2006.01)

(52) U.S. Cl.
CPC ................. *H05K 7/20509* (2013.01)

(58) Field of Classification Search
CPC ........... H05K 7/20509; H05K 7/20254; H05K 7/20772; H05K 7/20218; H05K 7/2039
USPC ........................................................ 165/185
See application file for complete search history.

(56) References Cited

U.S. PATENT DOCUMENTS

| | | | | |
|---|---|---|---|---|
| 9,482,472 B2* | 11/2016 | Hwang | ................... | F28F 3/12 |
| 11,129,297 B2* | 9/2021 | Chan | ................... | H05K 7/20509 |
| 11,160,192 B1* | 10/2021 | Yatskov | ............. | H05K 7/20436 |
| 11,197,391 B2* | 12/2021 | Chen | ......................... | G06F 1/20 |
| 2006/0171801 A1* | 8/2006 | Manabe | ................ | H01L 23/473 |
| | | | | 415/176 |
| 2009/0159244 A1* | 6/2009 | Mounioloux | ............. | G06F 1/20 |
| | | | | 165/104.33 |
| 2014/0119394 A1* | 5/2014 | Schleuning | ............. | H01S 5/405 |
| | | | | 372/36 |
| 2014/0254098 A1* | 9/2014 | Arvelo | .................... | F28D 15/00 |
| | | | | 361/699 |
| 2014/0334921 A1* | 11/2014 | Park | ....................... | F04D 29/586 |
| | | | | 415/175 |
| 2016/0143185 A1* | 5/2016 | Campbell | .......... | H05K 7/20218 |
| | | | | 165/104.31 |
| 2016/0363967 A1* | 12/2016 | Tsai | ................... | H05K 7/20272 |
| 2017/0192471 A1* | 7/2017 | Tsai | ....................... | H01L 23/473 |
| 2017/0235350 A1* | 8/2017 | Tsai | .......................... | G06F 1/20 |
| | | | | 165/80.4 |
| 2017/0339802 A1* | 11/2017 | Pan | ......................... | F28D 15/00 |
| 2019/0157186 A1* | 5/2019 | Campbell | ............. | B29C 43/203 |
| 2019/0208665 A1* | 7/2019 | Tsai | .................... | H05K 7/20254 |

(Continued)

*Primary Examiner* — Len Tran
*Assistant Examiner* — Gustavo A Hincapie Serna
(74) *Attorney, Agent, or Firm* — AMIN, TUROCY & WATSON, LLP

(57) ABSTRACT

Provided is a cold plate including: a heat absorption space for a working medium to be filled therein; a heat transfer structure disposed on a base within the heat absorption space for transferring thermal energy generated from a heat source that is in contact with the base to the working medium; and a flow guide structure disposed in the heat absorption space for guiding the working medium. The flow guide structure of the cold plate can effectively improve the efficiency of thermal energy absorption of the working medium.

20 Claims, 17 Drawing Sheets

(56) References Cited

U.S. PATENT DOCUMENTS

| | | | | |
|---|---|---|---|---|
| 2019/0239388 A1* | 8/2019 | Tsai | .................. | H05K 7/20254 |
| 2019/0317577 A1* | 10/2019 | Lin | ..................... | F04D 13/0673 |
| 2020/0053911 A1* | 2/2020 | Han | .................. | H05K 7/20263 |
| 2020/0173728 A1* | 6/2020 | Pan | .......................... | G06F 1/20 |
| 2020/0340767 A1* | 10/2020 | Holden | ................ | G01M 3/186 |
| 2020/0359528 A1* | 11/2020 | Tsai | .................. | H05K 7/20281 |
| 2021/0015001 A1* | 1/2021 | Xiao | .................. | H05K 7/20272 |
| 2022/0210949 A1* | 6/2022 | Edmunds | ........... | H05K 7/20272 |

* cited by examiner

COLD PLATE

BACKGROUND

1. Technical Field

The present disclosure relates to the heat dissipation field, and more particularly, to a cold plate.

2. Description of Related Art

Computers and various electronic devices have seen rapid development with ever increasing efficiency in response to demands for modernization. In this development, high-performance hardware is accompanied by heat dissipation issues. In general, heat dissipating components are usually used in computers and various electronic devices for heat dissipation. For example, a thermal paste or a heat sink can be adhered to an electronic component subjected to heat dissipation in order to absorb and dissipate heat. However, the effect of heat dissipation for this type of approach is limited, and heat dissipating modules that employs liquid cooling has thus been developed.

Coolants are usually used in existing heat dissipating modules employing liquid cooling in order to absorb thermal energy. For example, a coolant is made to be in fluid communication with an electronic component subjected to heat dissipation. Heated coolant can then flow to a place with lower temperature for heat transfer. Afterwards, the coolant that has undergone heat transfer can then flow back to the electronic component subjected to heat dissipation to absorb thermal energy, thereby creating a heat dissipating cycle.

However, in the existing heat dissipating module, when delivering the coolant to a space for absorbing thermal energy in the electronic component subjected to heat dissipation, the coolant is often affected by the suction of a pump disposed above the heat absorption space, so the coolant cannot effectively flow to areas (e.g., into slits between fins) in the heat absorption space that are closer to the electronic component subjected to heat dissipation. As a result, heat cannot be taken away effectively, thereby lowering the heat absorption efficiency of the coolant.

Therefore, there is a need for a cold plate that solves the aforementioned problems.

SUMMARY

The present disclosure is to provide a cold plate, which includes: a casing; a base combined with the casing to form a working space in which a working medium flows; a heat transfer structure disposed on an inner side of the base for transferring thermal energy created by a heat source in contact with an outer side of the base to the working medium inside the working space via a path formed by the base and the heat transfer structure; a pump disposed above the heat transfer structure for partitioning the working space into a heat absorption space and a drainage space and driving the working medium to flow from the heat absorption space to the drainage space; and a flow guide structure disposed in the heat absorption space for guiding the working medium.

In the cold plate above, the flow guide structure includes a guiding baffle formed with a top portion and two side walls extending perpendicularly from two ends of the top portion.

In the cold plate above, a groove is formed around a periphery of the heat transfer structure disposed on the inner side of the base for allowing the two side walls to wedge thereinto.

In the cold plate above, the groove has a positioning indentation, and the side wall has a positioning protrusion to be wedged to the positioning indentation.

In the cold plate above, the positioning indentation and the positioning protrusion are arranged perpendicular to a flow direction of the working medium.

In the cold plate above, the flow guide structure further includes a stopper block for reducing the time the working medium stays at edges of the heat absorption space.

In the cold plate above, the stopper block includes a top piece and two side pillars perpendicularly extending from two ends of the top piece, and the two side pillars are wedged into the groove.

In the cold plate above, the groove has a positioning indentation, and the side pillar has a positioning protrusion to be wedged to the positioning indentation.

In the cold plate above, the positioning indentation and the positioning protrusion are arranged perpendicular to a flow direction of the working medium.

In the cold plate above, sides of the top piece of the stopper block facing the inner side of the base and adjacent the heat transfer structure are formed with at least one guiding bevel.

In the cold plate above, the guiding baffle is connected to the stopper block via at least one connecting portion, and the guiding baffle, the stopper block and the connecting portion are jointly defined with an opening underneath the pump.

In the cold plate above, the guiding baffle, the stopper block and the connecting portion are integrally formed into one piece.

In the cold plate above, an edge of the top portion facing the heat transfer structure has at least one guiding bevel.

In the cold plate above, an edge of the top portion facing the heat transfer structure has at least one cut.

In the cold plate above, an inner side of the top portion facing the heat transfer structure has at least one boundary layer destruction structure for reducing the fluid flow pressure.

In the cold plate above, the boundary layer destruction structure is arranged perpendicularly or horizontally to a flow direction of the working medium.

In the cold plate above, the boundary layer destruction structure is a groove.

In the cold plate above, the flow guide structure is disposed above a portion of the heat transfer structure, and the pump is disposed above another portion of the heat transfer structure.

In the cold plate above, the flow guide structure is a protruding structure extending from the casing towards the heat transfer structure.

In the cold plate above, the flow guide structure is an extension structure of the heat transfer structure, and a height of the extension structure of the heat transfer structure is in close proximity to an inner side of the casing.

The present disclosure is also to provide a cold plate, which includes: a heat absorption space in which a working medium flows; a heat transfer structure disposed on a base and in the heat absorption space for transferring thermal energy created by a heat source in contact with the base to the working medium; and a flow guide structure disposed above a portion of the heat transfer structure and in the heat absorption space for guiding the working medium.

In the cold plate above, a groove is formed around a periphery of the heat transfer structure.

In the cold plate above, the flow guide structure includes a guiding baffle including a top portion and two side walls extending perpendicularly from two ends of the top portion, and the two side walls are wedged into the groove.

In the cold plate above, the flow guide structure further includes a stopper block including a top piece and two side pillars perpendicularly extending from two ends of the top piece, and the two side pillars are wedged into the groove.

In the cold plate above, the groove has a first positioning indentation for a first positioning protrusion of the side wall to be wedged thereinto, and the groove has a second positioning indentation for a second positioning protrusion of the side pillar to be wedged thereinto.

In the cold plate above, the first positioning indentation and the first positioning protrusion are arranged perpendicular to a flow direction of the working medium, and the second positioning indentation and the second positioning protrusion are arranged perpendicular to the flow direction of the working medium.

In the cold plate above, the top piece has a side that includes at least one guiding bevel.

In the cold plate above, the guiding baffle is connected to the stopper block via at least one connecting portion.

In the cold plate above, the guiding baffle, the stopper block and the connecting portion are integrally formed into one piece.

In the cold plate above, the top portion has an edge that includes at least one guiding bevel or cut.

In the cold plate above, the top portion has an inner side that includes at least one boundary layer destruction structure.

In the cold plate above, the boundary layer destruction structure is arranged perpendicularly or horizontally to a flow direction of the working medium.

In the cold plate above, the boundary layer destruction structure is a groove.

In the cold plate above, the flow guide structure is a protruding structure extending from a casing above the heat transfer structure towards the heat transfer structure.

In the cold plate above, the flow guide structure is an extension structure of the heat transfer structure, and a height of the extension structure of the heat transfer structure is in close proximity to an inner side of a casing above the heat transfer structure.

DETAILED DESCRIPTION

Figure 1:
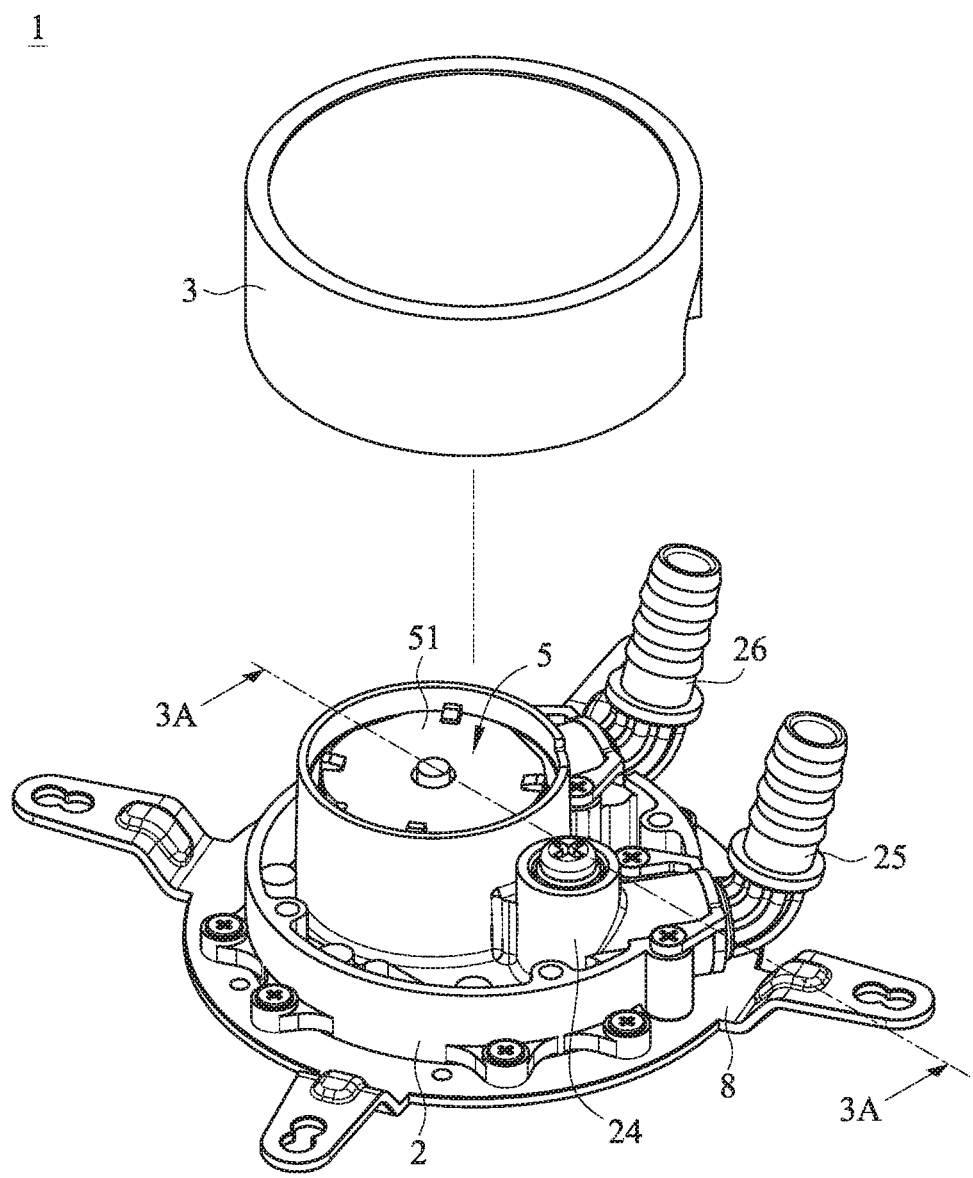
FIG. 1 is a schematic view of a cold plate in accordance with the present disclosure.
Figure 2:
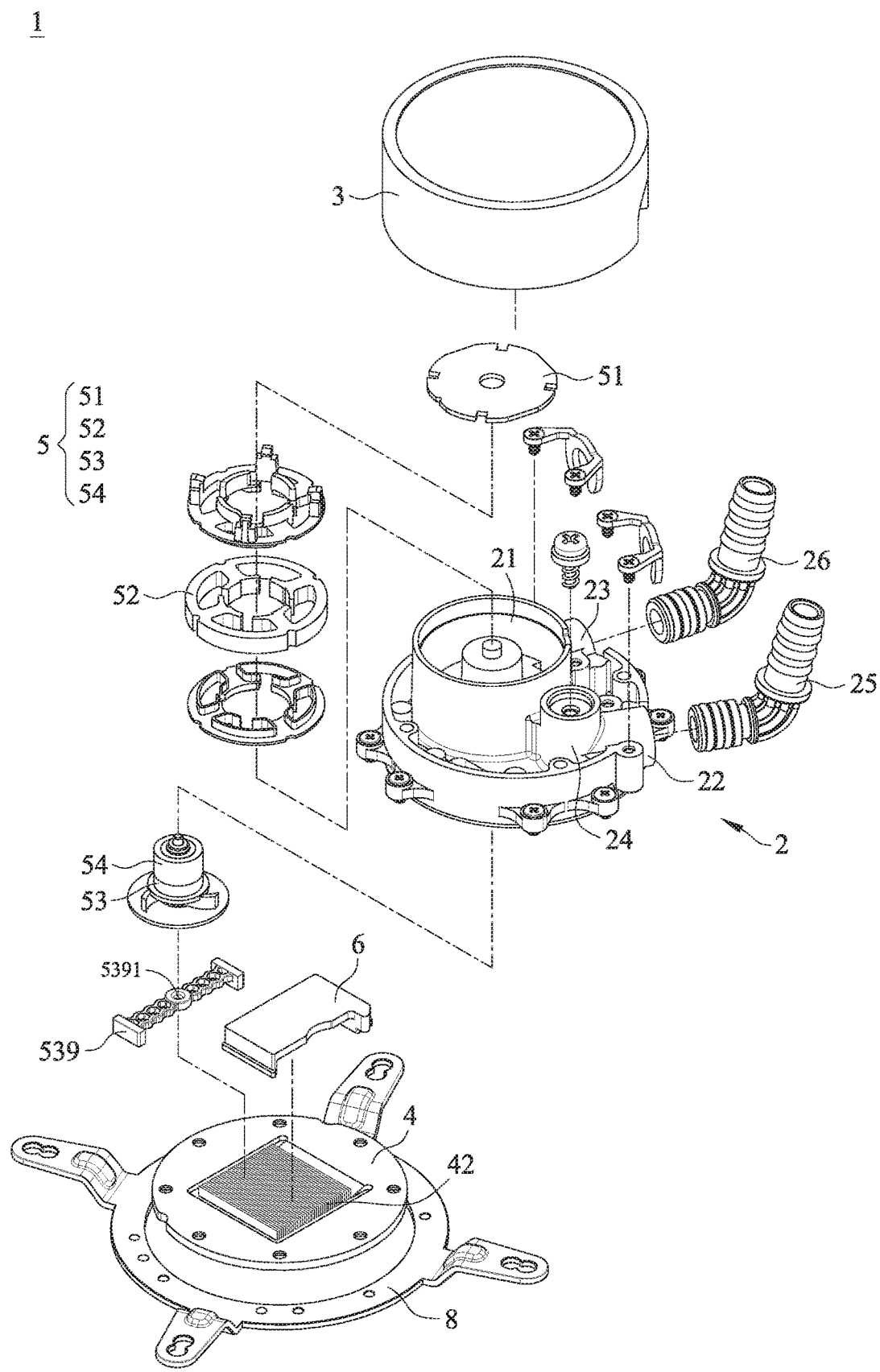
FIG. 2 is a schematic exploded view of FIG. 1.

Implementations of the present disclosure are described below by specific embodiments. Other advantages and technical effects of the present disclosure can be readily understood by one of ordinary skill in the art upon reading the disclosure of this specification. The present disclosure may also be implemented or applied in other different embodiments.

A cold plate provided by the present disclosure can be installed in an electronic device such as a mainframe of a computer or a server. The cold plate can be filled with a working medium (e.g., a coolant). The working medium can absorb the thermal energy produced by a heat source (e.g., an electronic component such as a chip or a memory). The heated working medium can then be transferred to a cooling device to be cooled. After this, the cooled working medium is returned to the cold plate for another cycle of heat absorption and circulation.

Referring to FIGS. 1, 2, 3A and 3B, a cold plate 1 provided in accordance with the present disclosure includes a casing 2, a cover 3, a base 4 and a pump 5. The casing 2 is a main structural component of the cold plate 1 and is combined with the cover 3 at the top, the base 4 at the bottom, and a fluid inlet connector 25 and a fluid outlet connector 26 at the sides. The casing 2 can be combined with the aforementioned components through fastening components such as screw holes, studs, etc. formed on various locations of the casing 2 to facilitate fastening at the time of assembly with the cover 3, the base 4 and the fluid inlet connector 25 or the fluid outlet connector 26. However, the present disclosure is not limited to this type of combination.

In an embodiment, the casing 2 structurally defines different chambers and passages, including an electromechanical chamber 21, an inlet passage 22, an outlet passage 23 and a fluid injecting passage 24, wherein the electromechanical chamber 21 is opened at the top of the casing 2 facing the cover 3. The electromechanical chamber 21 is independent (e.g., insulated) from the path of the working medium in the cold plate 1 to protect the electrical components in the electromechanical chamber 21 and prevent the working medium from entering the electromechanical chamber 21 and short circuiting the electrical components.

In an embodiment, the pump 5 includes a circuit board 51, a first magnetic component 52, an impeller 53 and a second magnetic component 54, wherein the circuit board 51 and the first magnetic component 52 can be disposed in the electromechanical chamber 21, while the impeller 53 and the second magnetic component 54 are disposed on the other side of the electromechanical chamber 21 (i.e., in the flow path of the working medium), and wherein the circuit board 51 provides the power needed for the operations of the pump 5, and is connected with a power supply (not shown) via a wired connection (e.g., via wires) or a wireless connection (e.g., by electromagnetic induction). In an embodiment, the circuit board 51 and the first magnetic component 52 are isolated from the impeller 53 and the second magnetic component 54 via the casing 2, but the first magnetic component 52 and the second magnetic component 54 are still co-axially disposed. In an embodiment, the first magnetic component 52 and the second magnetic component 54 can be made of a material selected from a magnet or other magnetically driven or attracted materials. In addition, the second magnetic component 54 is combined with the impeller 53. When the pump 5 is energized, the impeller 53 connected to the second magnetic component 54 can then be driven into rotations as a result of the interactions between of the circuit board 51, the first magnetic component 52 and the second magnetic component 54, which enables the working medium to flow.

In an embodiment, the base 4 is used for absorbing thermal energy. The material of the base 4 can be selected from a metal or other materials with good thermal conductivities. Structurally, the base 4 can be a one-piece (integral) structure or a composite structure with a plurality of layers or components. The present disclosure is not limited as such. The outer side of the base 4 (i.e., the side distal to the casing 2) has a heat absorption face 41. The inner side 43 of the base 4 (i.e., the side facing the casing 2) is formed (or provided) with a heat transfer structure 42. The heat absorption face 41 can come into direct or indirect contact with the heat source, such that the heat absorption face 41 absorbs the thermal energy produced by the heat source and transfer the thermal energy to the heat transfer structure 42. The heat transfer structure 42 will then transfer the thermal energy to the working medium (not shown) through contact with the working medium.

In an embodiment, the heat transfer structure 42 of the base 4 can be skived fins or other columnar, sheet-like or irregularly shaped fins as long as they increase the contact area with the working medium to allow thermal energy to be transferred more rapidly to the working medium. The present disclosure is not limited to the heat transfer structure 42 shown herein.

In an embodiment, the cold plate 1 can be secured onto the heat source (e.g., a heat radiating electronic component) through a fastener 8 provided at the rim of the casing 2 and adjacent to the base 4. However, the present disclosure does not limit the way in which the cold plate 1 is secured onto the heat source.

Figure 3A:
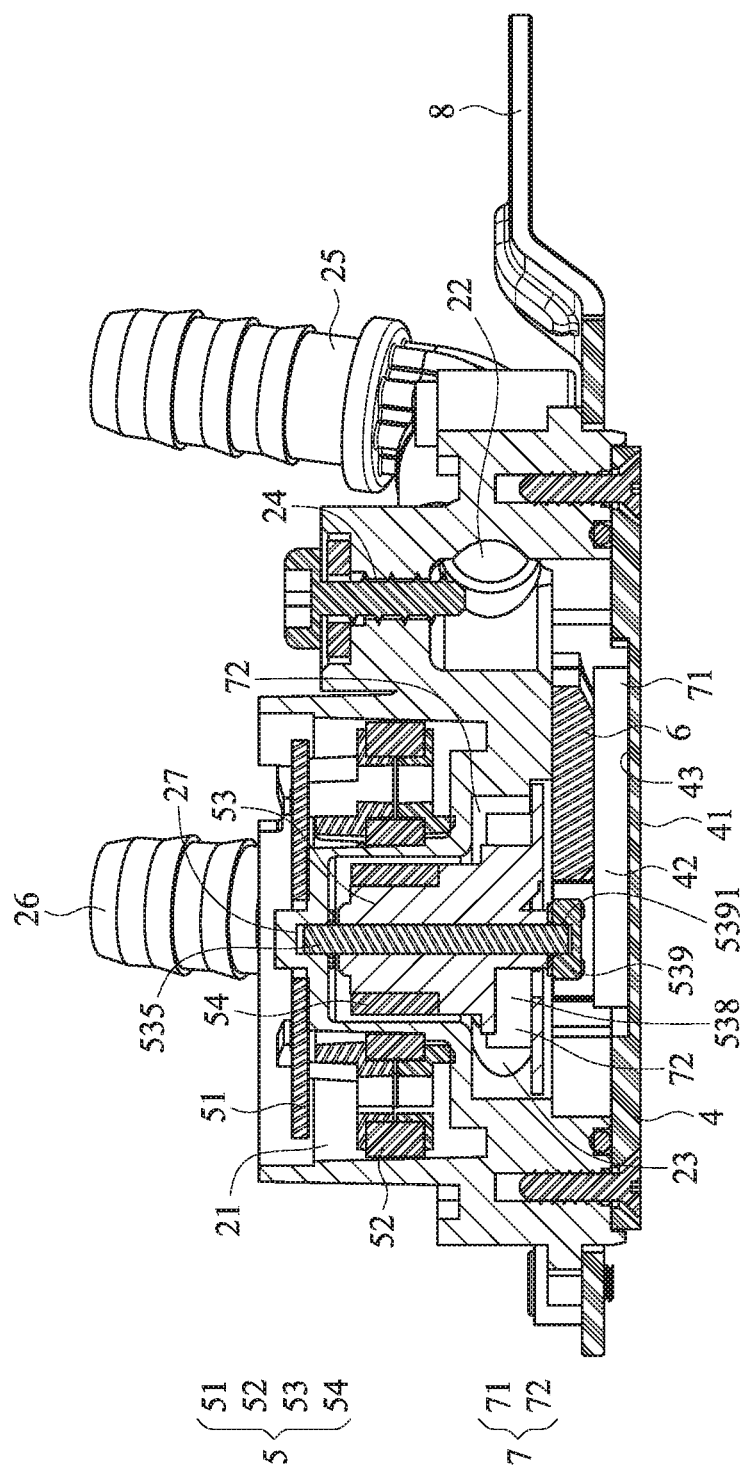
FIG. 3A is a schematic cross-sectional view of FIG. 1 along a cross-section line 3A-3A.
Figure 3B:
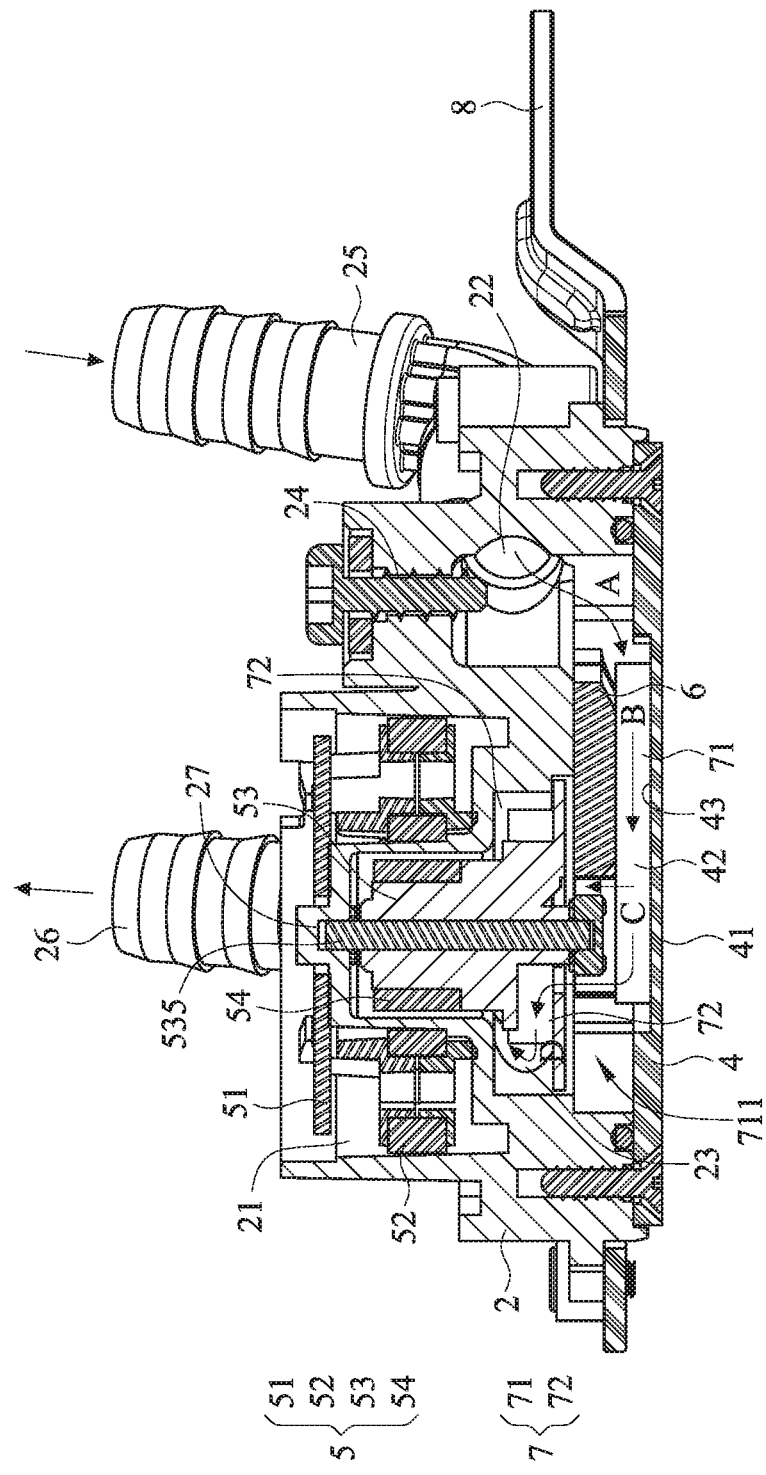
FIG. 3B is a schematic cross-sectional view of FIG. 1 along the cross-section line 3A-3A illustrated with the flow of a working medium.

Referring to FIG. 3A in conjunction with FIG. 3B, when the base 4 is combined with the casing 2, a working space 7 can be defined by the casing 2 and the base 4 together. The working space 7 can be filled with working medium and allows the working medium to flow. In an embodiment, the working space 7 is partitioned into a heat absorption space 71 and a drainage space 72 by the impeller 53 of the pump 5 without depending on other walls or partitions, thereby simplifying the internal structure of the cold plate 1. In an embodiment, the inlet passage 22 of the casing 2 is in communication with the heat absorption space 71 to allow a cooled working medium to flow into the heat absorption space 71, such that the working medium absorbs the thermal energy delivered by the heat transfer structure 42. The impeller 53 is capable of sucking the working medium directly from the heat absorption space 71 to the drainage space 72. Furthermore, the outlet passage 23 is in communication with the drainage space 72, such that the heated working medium can be transmitted outside of the cold plate 1 for cooling. Moreover, the inlet passage 22 and the outlet passage 23 can be further extended outside or connected with the fluid inlet connector 25 and the fluid outlet connector 26, respectively. The fluid inlet connector 25 and the fluid outlet connector 26 are in turn in communication with a cooling device (e.g., a radiator, a fan, etc.) via pipes (not shown). The fluid inlet connector 25 and the fluid outlet connector 26 can be connected onto the casing 2 vertically or laterally, or through bent configurations depending on the different spatial arrangements inside the cold plate 1. The present disclosure is not limited as such.

Figure 4A:
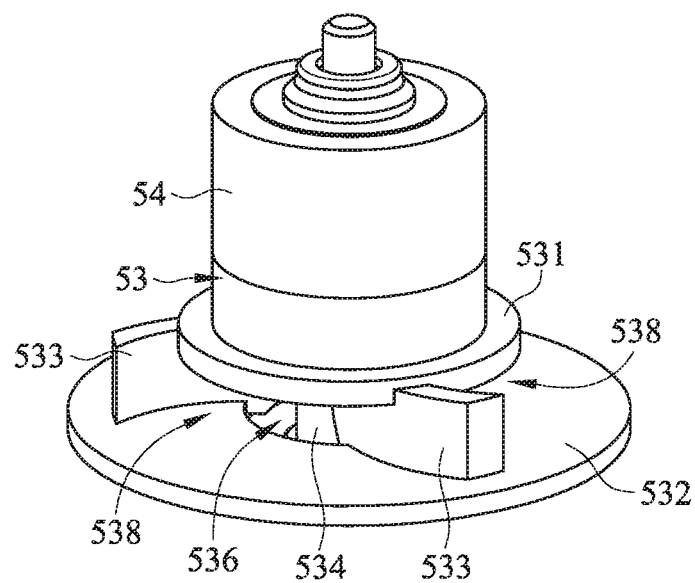
FIGS. 4A and 4B are schematic views of a pump in the cold plate in accordance with the present disclosure viewed from different perspectives.
Figure 4B:
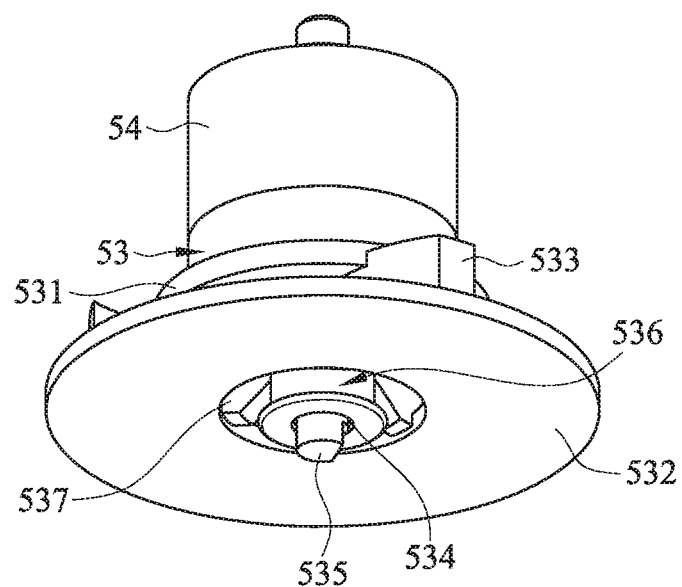

The overall structure of the impeller 53 of the pump 5 in the cold plate 1 of the present disclosure is further explained in details with reference to both FIGS. 4A and 4B. As described before, the working space 7 inside the cold plate 1 of the present disclosure is partitioned into the heat absorption space 71 and the drainage space 72 by the impeller 53 of the pump 5. Therefore, the impeller 53 itself has dual functions for drawing the working medium and expelling the working medium. In order to achieve these functionalities, the impeller 53 is disposed in the working space 7 and in proximity to the outlet passage 23, such that the working medium can be drawn directly from the heat absorption space 71 to the drainage space 72 before being discharged out of the cold plate 1 via the outlet passage 23. The impeller 53 includes a top piece 531, a base plate 532, vanes 533, a bushing 534 and a shaft 535, wherein a hollow portion 536 is formed between the base plate 532 and the bushing 534, and the base plate 532 and the bushing 534 are connected through at least one rib 537 in the hollow portion 536. The partitioning of the working space 7 into the heat absorption space 71 and the drainage space 72 is mainly attributed to the base plate 532 in the impeller 53. The heat absorption space 71 and the drainage space 72 are fluidly coupled via the hollow portion 536, that is, the working medium can flow into the drainage space 72 from the heat absorption space 71 through the hollow portion 536. The top piece 531 and the base plate 532 are spaced apart with a plurality of vanes 533 connected therebetween, thereby partitioning a plurality of drainage chambers 538. In the process of transmitting the working medium upwards from the heat absorption space 71 to the drainage space 72 via the hollow portion 536, the working medium first comes into contact with the top piece 531 and gets deflected to each of the drainage chambers 538. The working medium in each of the drainage chambers 538 is then sequentially spun into the outlet passage 23 due to the centrifugal force before being discharged from the cold plate 1. The top piece 531 of the impeller 53 not only has the guiding function that can change the flow direction, but also prevents the vanes 533 from coming into direct contact with the casing 2, thereby reducing the chance of wear and tear.

In an embodiment, the impeller 53 is driven by electromagnetic induction between the first magnetic component 52 and the second magnetic component 54, not by the shaft 535. Thus, there is no linkage relationship between the impeller 53 and the shaft 535. However, in order to maintain the durability and stability of the impeller 53 so that it does not rotate off axis or touch the casing 2 and produce attrition during rotation, the bushing 534 having a hollow structure is thus provided inside the impeller 53 and sheathed onto the shaft 535. In addition, in order to secure the shaft 535 in place, one end of the shaft 535 can be disposed in a receiving slot 27 at the top of the working space 7 (i.e., at the inner side of the casing 2), while the other end thereof can be secured through a fastening component 539. The fastening component 539 has a blind hole 5391 (or a through hole) into which the shaft 535 can be installed. Moreover, the fastening component 539 can be received and secured in a wedging groove 28 provided at the bottom of the casing 2 (as shown in FIG. 5C), or the fastening component 539 can be directly installed on the base 4, and the present disclosure is not limited as such. In an embodiment, when the shaft 535 is installed in the working space 7, the shaft 535 is preferably extended together with the fastening component 539 into the heat absorption space 71. This will increase the stability of the impeller 53 during rotation, but the present disclosure is not limited to this.

In an embodiment, considering the material of the impeller 53 itself, a shaft tube (not shown) can be further disposed and secured inside the bushing 534 if needed. The shaft tube is co-axially provided with the bushing 534 and the shaft 535, and is disposed between the bushing 534 and the shaft 535. The shaft tube can be made of an anti-wear or more durable material to reduce wear and tear during rotation of the impeller 53 relative to the shaft 535, thereby extending the life of the impeller 53.

In an embodiment, a flow guide structure can be further included in the cold plate 1 for guiding the working medium in the heat absorption space 71. The flow guide structure disclosed herein can be implemented in various structures, one example is a guiding baffle 6 shown in FIGS. 3A, 3B, 6A to 6G, other examples include a protruding structure 29 shown in FIG. 9 and a height variation in the heat transfer structure 42 shown in FIG. 10. Taking the guiding baffle 6 as an example of a flow guide structure, the guiding baffle 6 of the present disclosure (as well as the other flow guide structures) achieves at least the following functions including:

1. When the working medium flows from the inlet passage 22 into the heat absorption space 71, the working medium is forced to flow into the inside of the heat transfer structure 42, that is, into the slits between each two adjacent fins since the guiding baffle 6 is disposed on the gap or space between the casing 2 and the heat transfer structure 42, thereby successfully drawing away the thermal energy absorbed by the heat transfer structure 42. With the presence of the guiding baffle 6, the working medium can be prevented from passing directly above the heat transfer structure 42 without going inside the heat transfer structure 42 to effectively take the thermal energy away.

2. With the guiding structure of the guiding baffle 6, the working medium can more easily flow into the slits between two adjacent fins and also more easily drawn by the impeller 53 after coming out of the slits between two adjacent fins.

3. When there are dimensional tolerances in the casing 2 and the heat transfer structure 42 during production, or the sizes thereof are changed, it can be easily remedied by choosing a guiding baffle 6 of a different size, thickness or shape. Furthermore, the guiding baffle 6 is simpler than the casing 2 in terms of the structure, and also cheaper in terms of the cost of the mold. Therefore, when the design of the cold plate 1 is changed or the size of the cold plate 1 is adjusted slightly, a cheaper mold for the guiding baffle 6 instead of the more expensive mold of the casing 2 can be simply retooled, thereby saving cost.

Figure 5A:
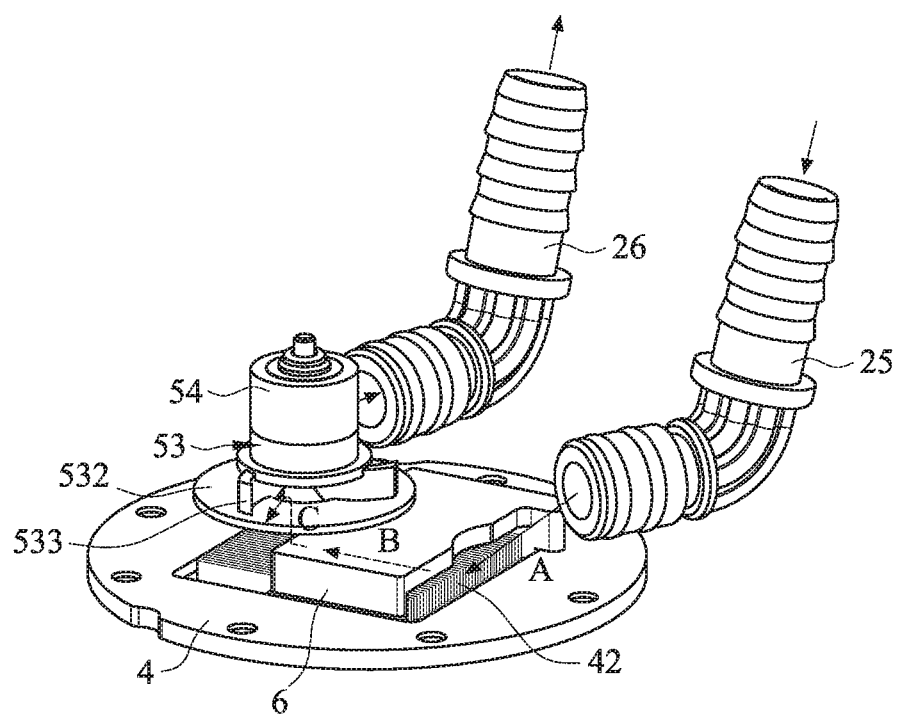
FIGS. 5A to 5C are schematic diagrams illustrating the flow of the working medium in the cold plate in accordance with the present disclosure viewed from different perspectives.
Figure 5B:
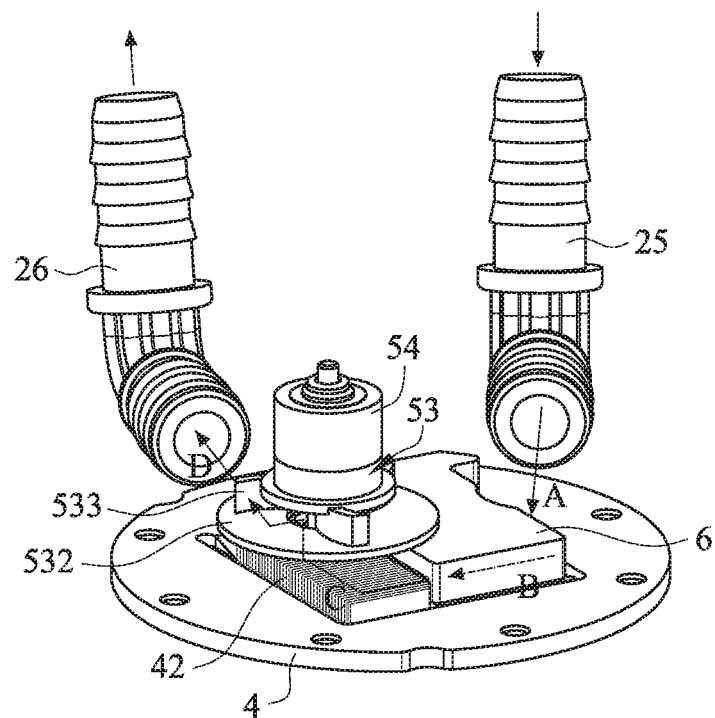
Figure 5C:
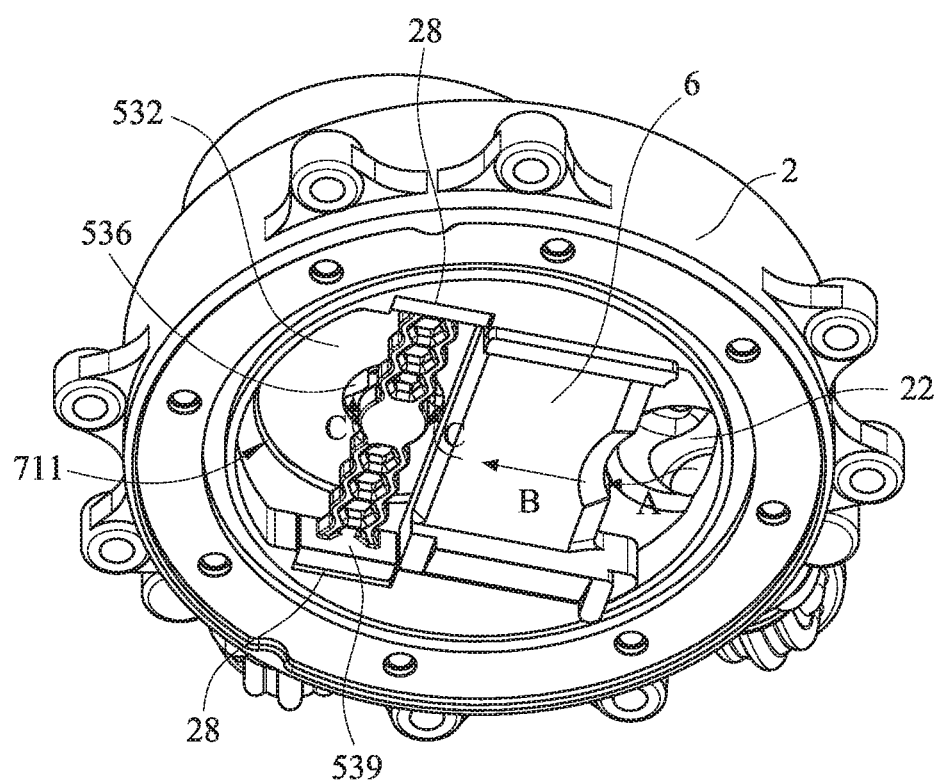

The flow of the working medium inside the cold plate 1 can be seen with reference to FIGS. 5A to 5C, in that the working medium, after entering the cold plate 1 via the inlet passage 22, flows between the guiding baffle 6 and the heat transfer structure 42 of the base 4, and is then drawn by the impeller 53, and finally entered from the drainage chambers 538 of the impeller 53 into the outlet passage 23. First, after flowing into the working space 7 from the inlet passage 22, the working medium is guided by the guiding baffle 6 along a direction indicated by arrow A into the inside of the heat transfer structure 42. Next, the working medium flows through the heat transfer structure 42 in the guiding baffle 6 along a direction indicated by arrow B and absorbs the thermal energy of the heat transfer structure 42. Then, after the working medium leaves the heat transfer structure 42, it is deflected upwards and drawn into the hollow portion 536 of the impeller 53, where it is then deflected again into the drainage chambers 538 with the guidance of the top piece 531 as indicated by arrow C. Finally, the working medium rotates with the drainage chambers 538 and is spun into the outlet passage 23 before leaving the cold plate 1 as indicated by arrow D.

In an embodiment, as shown in FIGS. 3A, 3B, 5A, 5B and 5C, the guiding baffle 6 does not cover the entire heat transfer structure 42. In other words, the guiding baffle 6 is only disposed above a portion of the heat transfer structure 42, and the pump 5 is located above the other portion of the heat transfer structure 42 where it is free of the guiding baffle 6. This ensures that the working medium can be directly drawn into the hollow portion 536 of the impeller 53 after absorbing the thermal energy from the heat transfer structure 42. Technical details of the guiding baffle 6 is further explained below.

Referring to FIGS. 6A to 6E at the same time, the structural features of the guiding baffle 6 are shown and how the guiding baffle 6 is combined onto the base 4 is further illustrated. In an embodiment, the heat transfer structure 42 is "dug" into the base 4, such that the horizontal height of the bottom of the heat transfer structure 42 is lower than that of the inner side 43 of the base 4. A groove 44 is formed around the periphery of the heat transfer structure 42.

In an embodiment, the guiding baffle 6 includes a top portion 61 and two side walls 62 and 63 extending perpendicularly from two ends of the top portion 61, so the guiding baffle 6 is formed into an "n" shaped structure, but the present disclosure is not limited as such. When the guiding baffle 6 is combined onto the base 4, the side walls 62 and 63 wedge into the groove 44.

In an embodiment, a first positioning indentation 44A may extend from the groove 44 of the base 4, and a corresponding first positioning protrusion 63A may also extend from one of the side walls 62 and 63 (the side wall 63 in this example) of the guiding baffle 6. The first positioning protrusion 63A can be wedged into the first positioning indentation 44A to further increase the stability of guiding baffle 6 combined onto the base 4.

Furthermore, in an embodiment, the first positioning indentation 44A and the first positioning protrusion 63A are oriented (extended) perpendicular to the direction of the flow of the working medium. In this manner, when the first positioning protrusion 63A of the side wall 63 is wedged into the first positioning indentation 44A of the groove 44, the guiding baffle 6 can be prevented from sliding relative to the base 4.

Figure 6A:
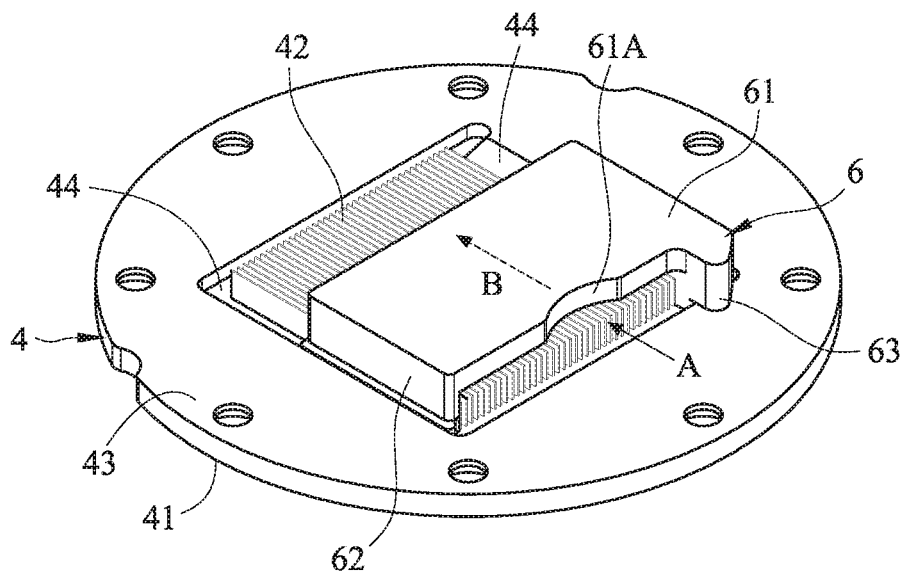
FIGS. 6A, 6D and 6E are schematic views of a flow guide structure combined with a base in the cold plate in accordance with the present disclosure viewed from different perspectives.
Figure 6B:
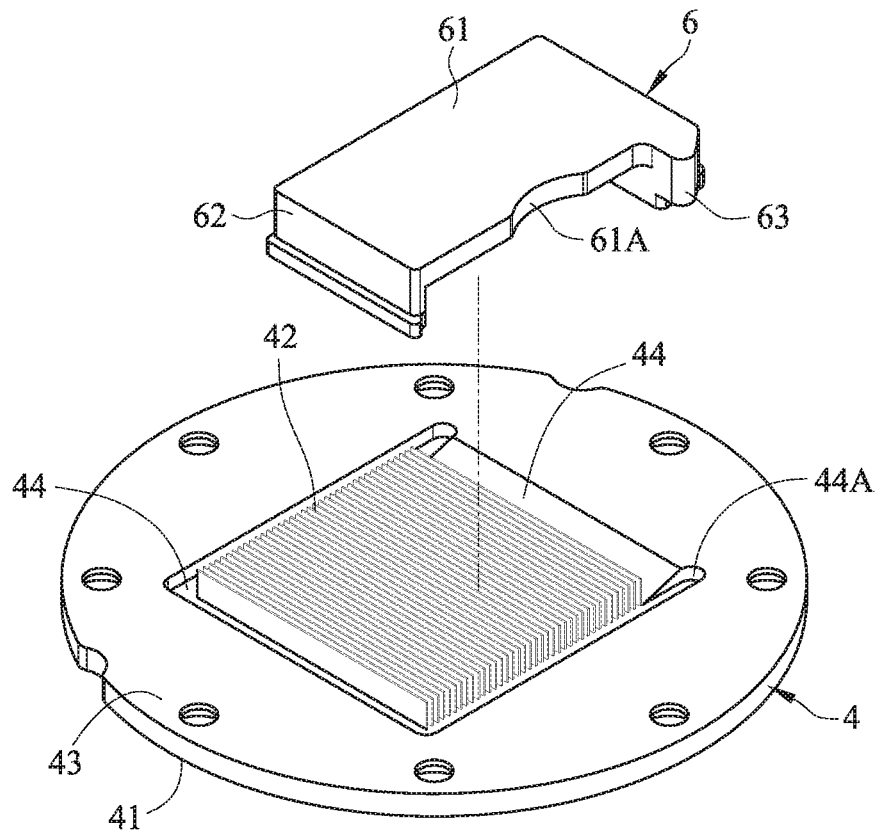
FIG. 6B is a schematic exploded view of FIG. 6A.
Figure 6C:
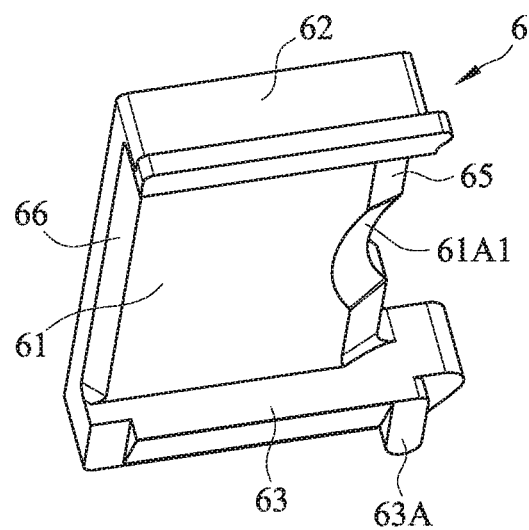
FIG. 6C is a schematic view of the flow guide structure in the cold plate in accordance with the present disclosure viewed from different perspective.
Figure 6D:
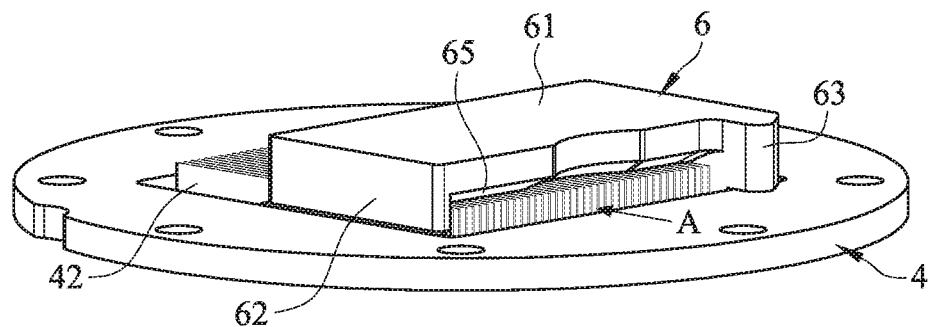
Figure 6E:
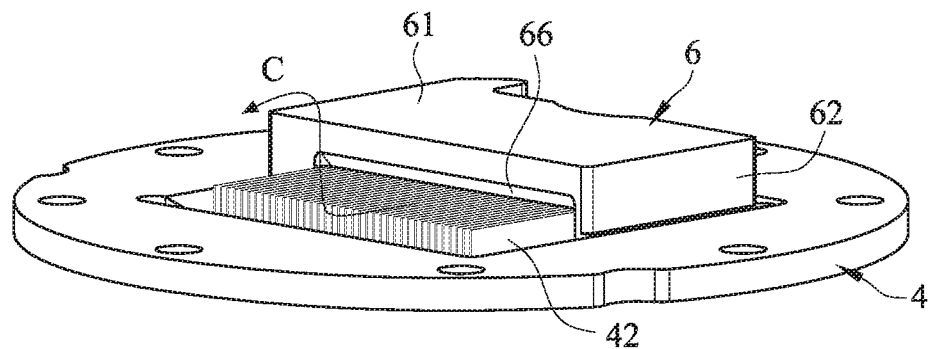

Moreover, in an embodiment, in order for the working medium to more easily flow into the inside of the heat transfer structure 42, that is, into the slits between two adjacent fins of the heat transfer structure 42, or for the working medium to be more easily drawn by the impeller 53 after leaving the heat transfer structure 42, at least one guiding bevels 65 and 66 can formed on edges of the inner side of the top portion 61 of the guiding baffle 6 (that is, the side facing the heat transfer structure 42) as shown in FIGS. 6C to 6E, so as to reduce the resistances at the inflow and the outflow ends. Moreover, if the working medium needs to be concentrated and directed to a particular portion (e.g., the central portion) of the heat transfer structure 42 in product design, a cut 61A can be formed on the top portion 61. The cut 61A can be further formed with a guiding bevel 61A1.

Figure 6F:
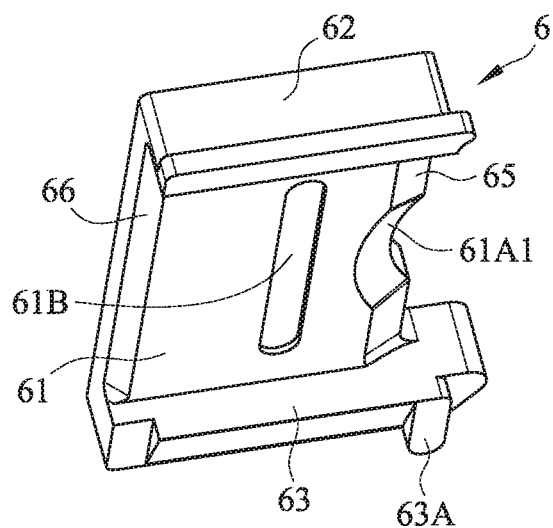
FIGS. 6F and 6G are schematic views of flow guide structures in cold plates in accordance with different embodiments of the present disclosure.
Figure 6G:
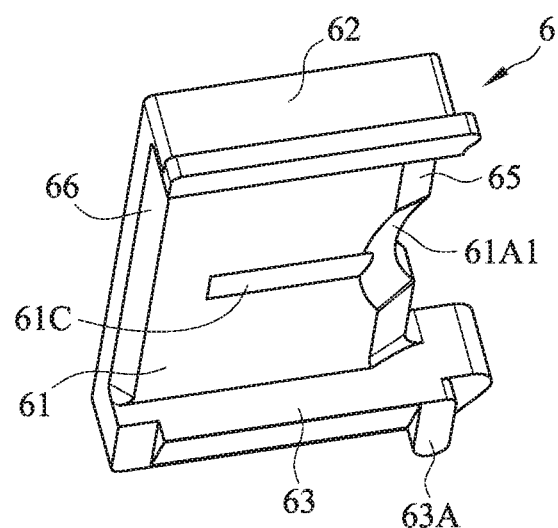

In an embodiment, as shown in FIGS. 6F and 6G, on the inner side of the top portion 61 facing the heat transfer structure 42, at least a boundary layer destruction structure can be formed to reduce the flow pressure of the fluid, and the boundary layer destruction structure can be a groove 61B or a groove 61C. In an embodiment, the boundary layer destruction structure can be formed perpendicular or horizontal to the flow direction of the working medium. As shown in FIG. 6F, the groove 61B is formed perpendicular to the flow direction of the working medium. As shown in FIG. 6G, the groove 61C is formed in parallel to the flow direction of the working medium. The present disclosure is not limited to the orientations and quantities of the grooves 61B and 61C disclosed herein, and the boundary layer destruction structure does not necessary have to be embodied as grooves 61B or 61C as long as a non-planar surface structure is formed on the inner side of the top portion 61 facing the heat transfer structure 42 that similarly achieves the purpose of reducing fluid flow pressure.

Figure 7A:
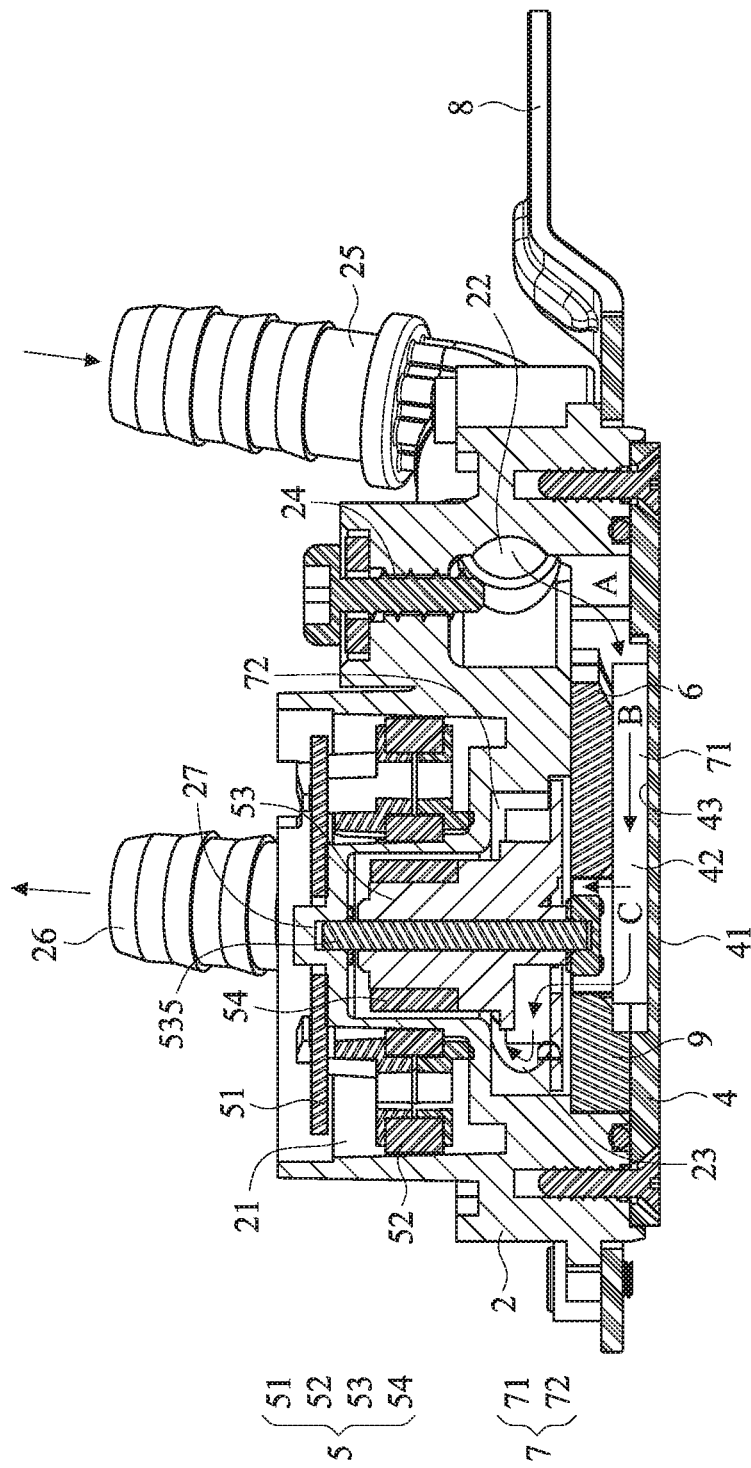
FIG. 7A is a schematic cross-sectional view of a flow guide structure in a cold plate in accordance with a different embodiment of the present disclosure.

Referring to FIG. 7A, the guiding baffle 6 of the cold plate 1 of the present disclosure can be further used together with a stopper block 9 to reduce the time that the working medium stays at the edges of the heat absorption space 71. For example, the stopper blocker 9 stops the working medium from entering into a turnaround space 711 (shown in FIG. 5C) at the rear end of the heat absorption space 71, thus preventing the working medium from lingering in this space, thereby improving the efficiency of the impeller 53 in absorbing the working medium.

Figure 7B:
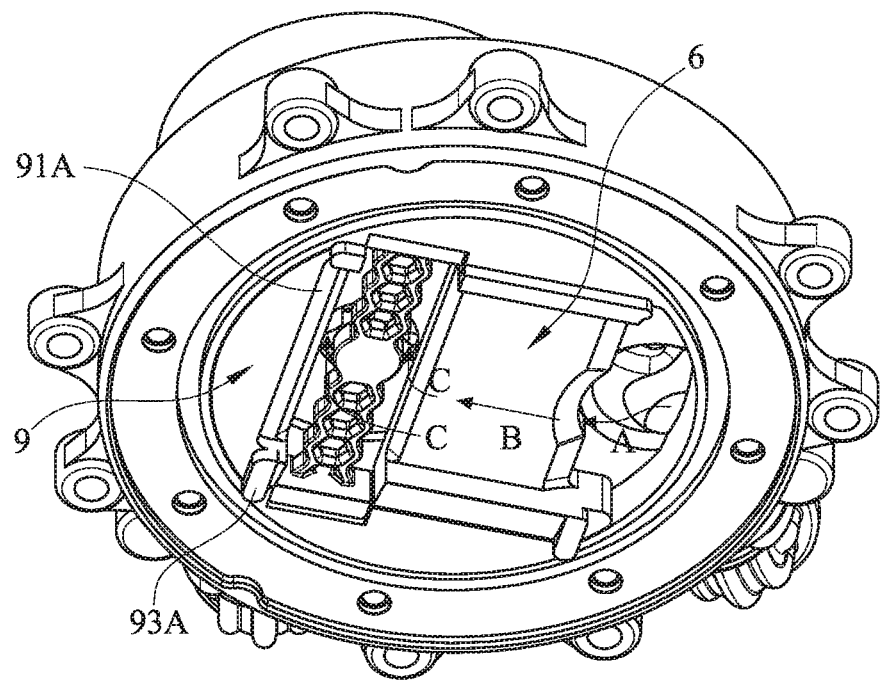
FIG. 7B is a schematic view of FIG. 7A viewed from a different perspective.

Referring to FIGS. 5C and 7B at the same time, configurations of the cold plate 1 with and without the stopper block 9 are shown. In the embodiment illustrated in FIG. 5C, at the bottom of the casing 2 of the cold plate 1, one side of the fastening component 539 has a curved space. When the casing 2 and the base 4 are assembled together, this space becomes the turnaround space 711 at the edge of the heat absorption space 71 in which the working medium may temporarily linger and turn around before being drawn upwards by the base plate 532 of the impeller 53 into the drainage space 72. However, if the working medium stays in the turnaround space 711 for too long, the efficiency of the cold plate 1 in taking the thermal energy away may be reduced. Therefore, in other embodiments of the present disclosure (as shown in FIG. 7B), the stopper block 9 is provided to seal and fill the turnaround space 711, which forces the working medium, after passing through the heat transfer structure 42, to be drawn by the impeller 53 directly upwards along the direction indicated by arrow C through the gap between the guiding baffle 6 and the stopper block 9. This reduces the chance of the working medium lingering in the turnaround space 711. Technical details of the stopper block 9 is further explained below.

Figure 7C:
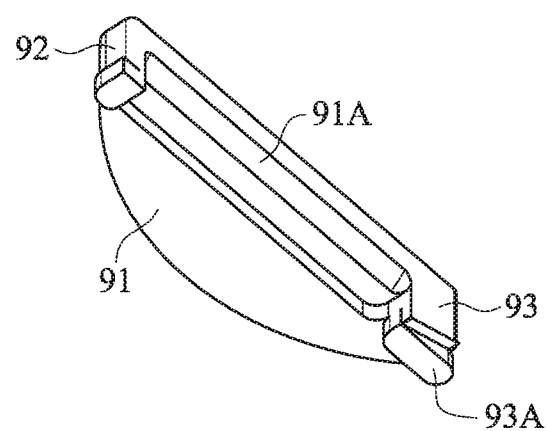
FIG. 7C is a schematic view of the flow guide structure in FIG. 7A.
Figure 7D:
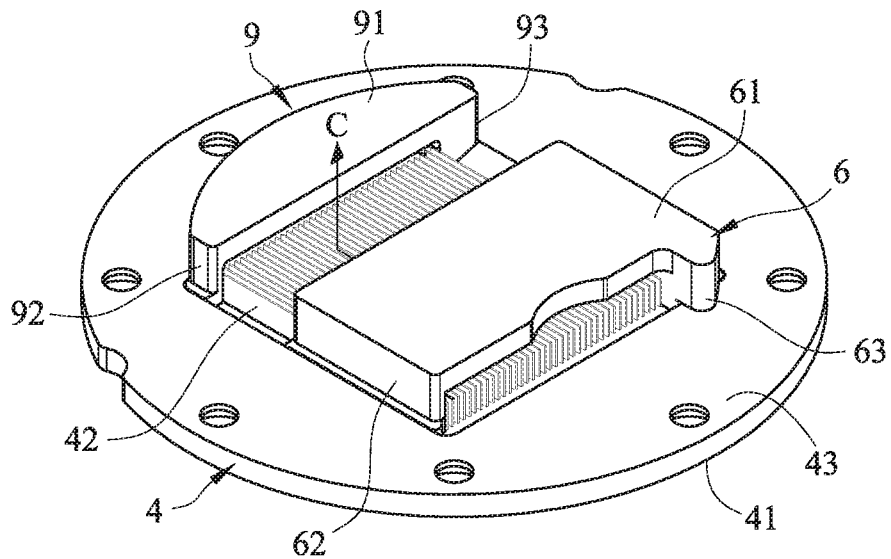
FIG. 7D is a schematic view of the flow guide structure combined with a base in a cold plate in accordance with the present disclosure.
Figure 7E:
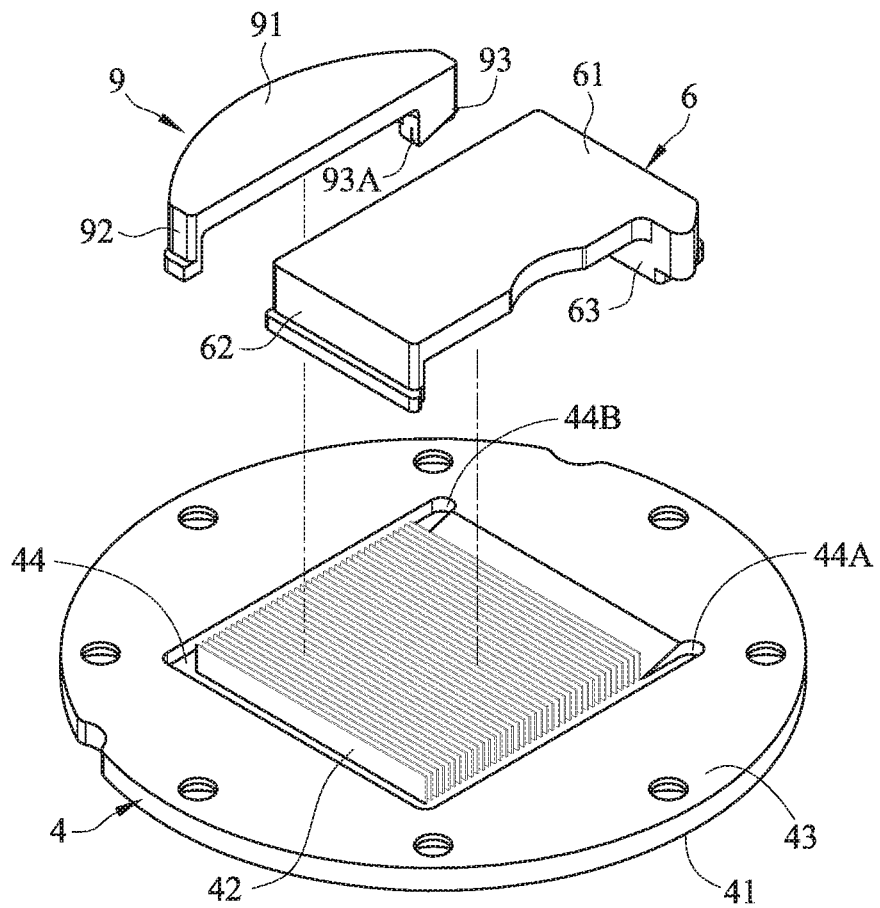
FIG. 7E is a schematic exploded view of FIG. 7D.

Referring to FIGS. 7C to 7E at the same time, the stopper block 9 includes a top piece 91 and two side pillars 92 and 93, wherein the top piece 91 corresponds to the bottom of the casing 2 and has an arc shape. The thickness of the top piece 91 is approximately the relative distance of the casing 2 and the base 4 in the turnaround space 711. The two side pillars 92 and 93 each extends perpendicularly from either end of the top piece 91, so the stopper block 9 is a "n" shaped structure, but the present disclosure is not limited to this. When the guiding baffle 6 is combined onto the base 4, the side pillars 92 and 93 will wedge into the groove 44.

In an embodiment, a second positioning indentation 44B may extend from the groove 44 of the base 4, while a corresponding second positioning protrusion 93A may extend from one of the side pillars 92 and 93 of the stopper block 9 (the side pillar 93 in this example). The second positioning protrusion 93A can wedge into the second positioning indentation 44B to increase the stability of the stopper block 9 combined onto the base 4.

Furthermore, in an embodiment, the second positioning indentation 44B and the second positioning protrusion 93A are oriented (extended) in perpendicular to the direction of the flow of the working medium. In this manner, when the second positioning protrusion 93A of the side pillar 93 is wedged into the second positioning indentation 44B of the groove 44, the stopper block 9 can be effectively prevented from sliding relative to the base 4.

Moreover, in an embodiment, a guiding bevel 91A can be formed on sides of the top piece 91 of the stopper block 9 facing the inner side 43 of the base 4 and adjacent the heat transfer structure 42, such that the working medium flowing to the rearmost end of the heat transfer structure 42 can be deflected upwards via the guiding bevel 91A. As can be seen in FIG. 7D, after flowing through the heat transfer structure 42, the working medium can be turned to flow upwards through the gap between the guiding baffle 6 and the stopper block 9 as shown by the direction of arrow C, and then drawn into the base plate 532 of the impeller 53.

Figure 8A:
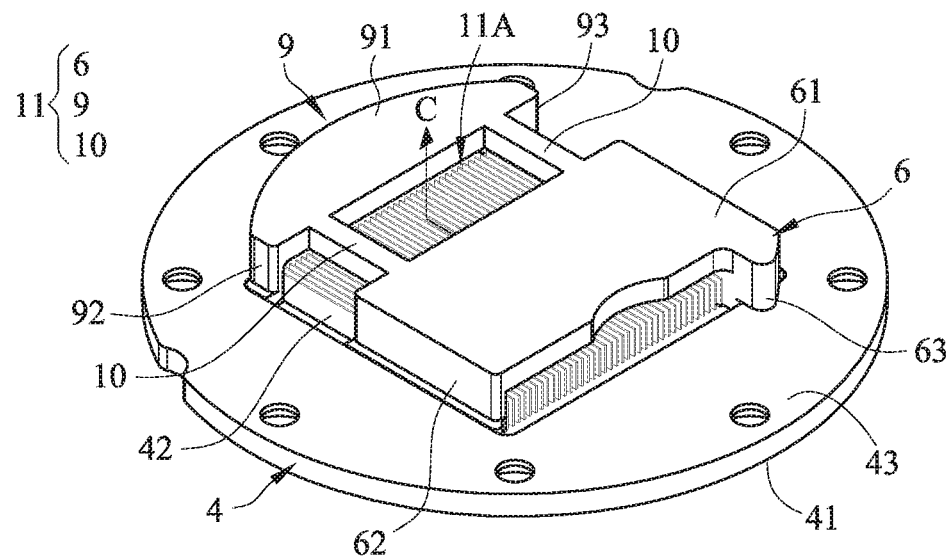
FIG. 8A is a schematic view of a flow guide structure in a cold plate in accordance with yet another embodiment of the present disclosure.
Figure 8B:
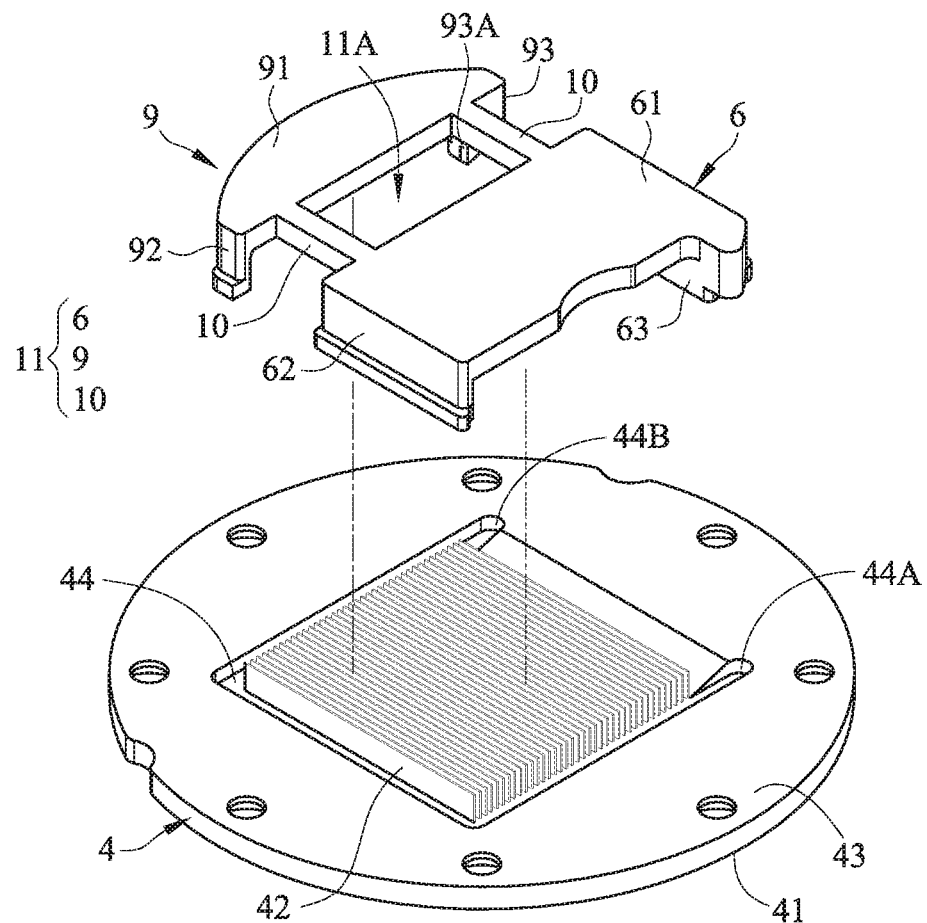
FIG. 8B is a schematic exploded view of FIG. 8A.
Figure 8C:
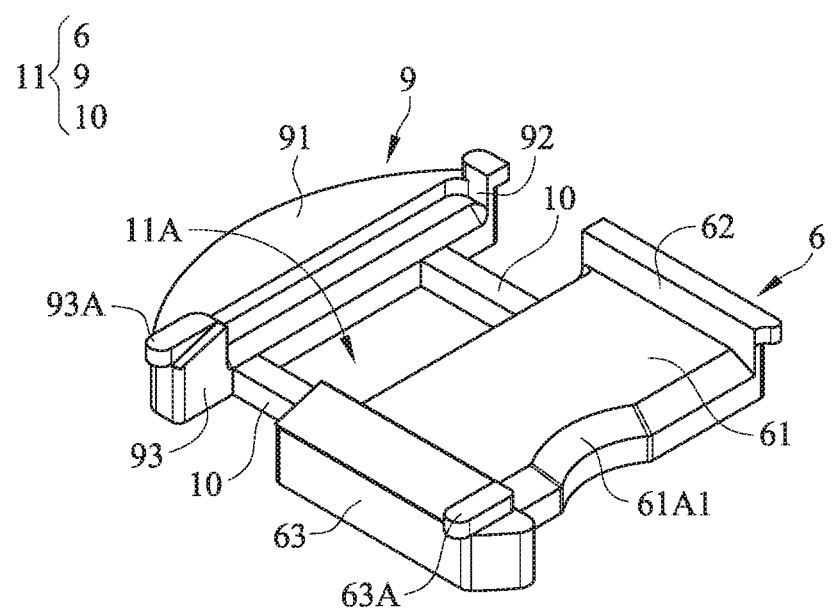
FIG. 8C is a schematic view of the flow guide structure in FIG. 8A.

Referring to FIGS. 8A to 8C, at least one connecting portion 10 can be used to connect the top portion 61 of the guiding baffle 6 and the top piece 91 of the stopper block 9 together into a one-piece design. For example, the guiding baffle 6, the stopper block 9 and the connecting portion 10 together form a one-piece gasket 11. After flowing through the heat transfer structure 42, the working medium can be drawn upwards by the impeller 53 (not shown) through an opening 11A (underneath the pump 5) jointly defined by the guiding baffle 6, the stopper block 9 and the connecting portion 10 in the direction indicated by arrow C into the drainage space 72 (not shown). Such one-piece design of joining the guiding baffle 6 and the stopper block 9 together with the connecting portion 10 lowers the cost of molding, simplifies the overall structure of the cold plate 1 and facilitates the assembly of the guiding baffle 6 and the stopper block 9.

Figure 9:
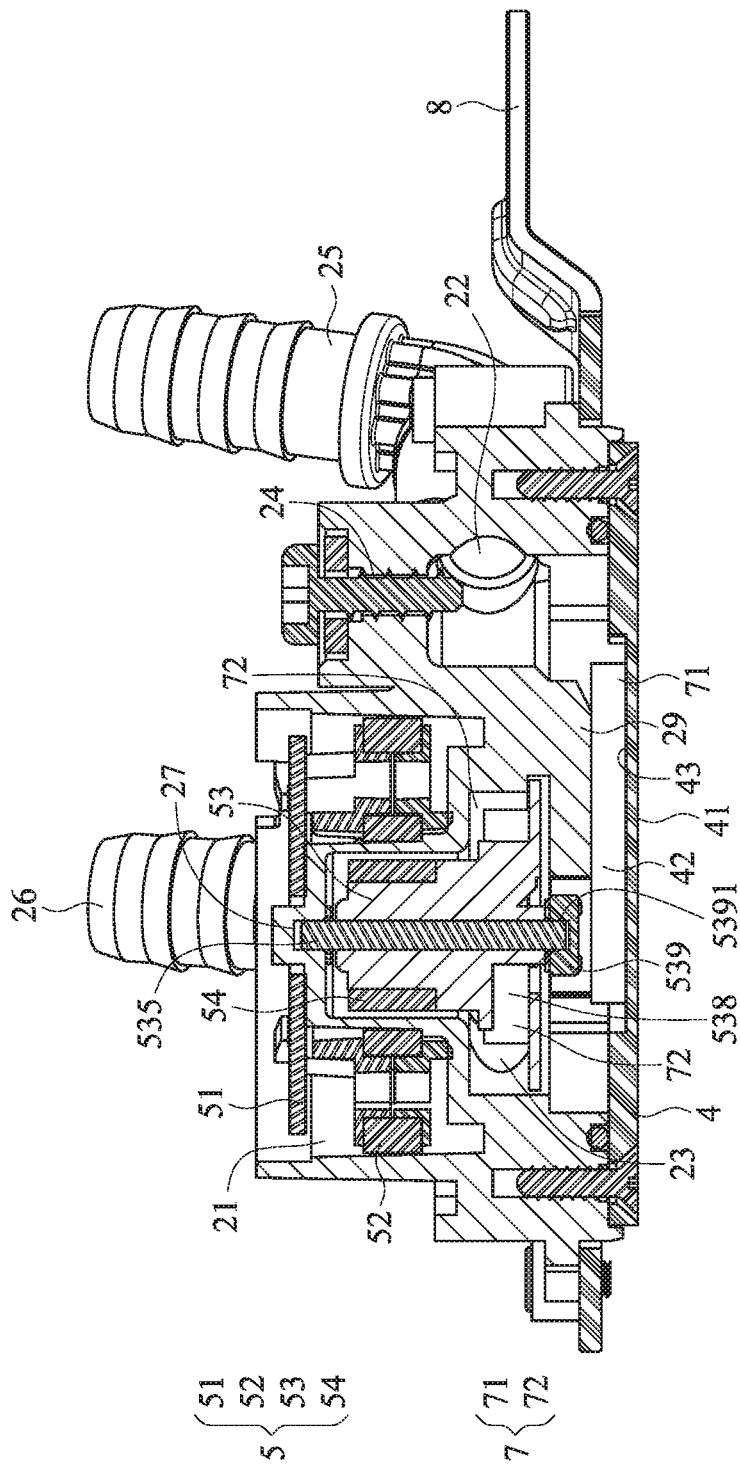
FIG. 9 is a schematic view of a flow guide structure in a cold plate in accordance with still another embodiment of the present disclosure.
Figure 10:
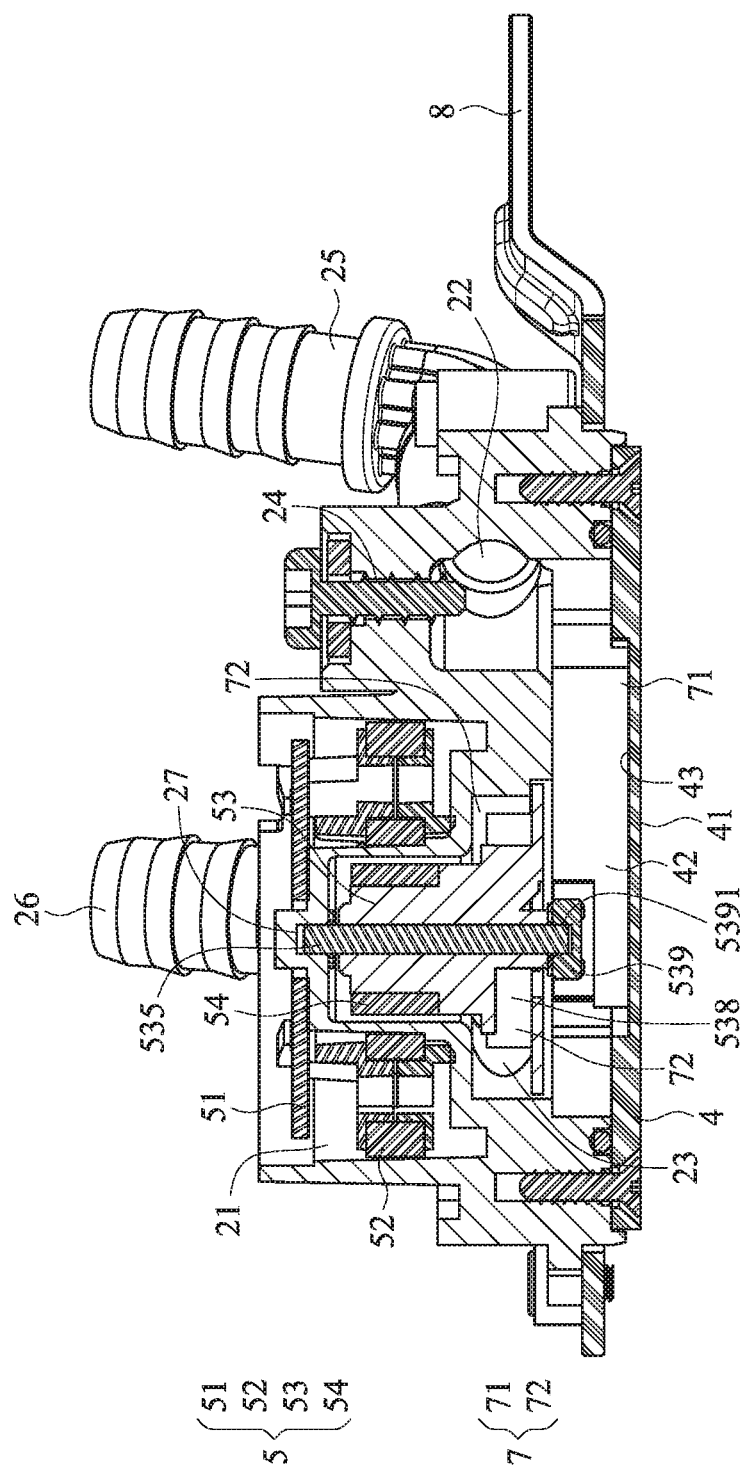
FIG. 10 is a schematic view of a flow guide structure in a cold plate in accordance with a further embodiment of the present disclosure.

Further embodiments of the flow guide structure of the present disclosure are described. As shown in FIG. 9, the flow guide structure can be embodied by a protruding structure 29 extending directly from the casing 2 downwards towards the heat transfer structure 42. The protruding structure 29 can extend close to the top of the heat transfer structure 42, such that when the working medium is flowing in the heat absorption space 71, the working medium is constricted by the protruding structure 29 to flow inside of the heat transfer structure 42, achieving the same function of the guiding baffle 6 described before. In addition, as shown in FIG. 10, the flow guide structure can also be embodied by raise the height of the heat transfer structure 42, so that it is in close proximity to the inner side of the casing 2. For example, the height of the fins of the heat transfer structure 42 can vary in that the fins in the heat absorption space 71 near the inlet passage 22 can be formed with an extension structure with a height that is high enough such that the extension structure is in close proximity to the inner side of the casing 2, while the fins of the heat transfer structure 42 underneath the pump 5 can be lower to form a space to accommodate the fastening component 539 of the pump 5. Although various different flow guide structures are described above, any flow guide structure that allows the working medium to flow further inside the heat transfer structure 42 should be construed as within the scope of the present disclosure.

With the flow guide structure provided in the cold plate of the present disclosure, the working medium in the heat absorption space can more effectively flow closer to the electronic component subject to heat dissipation, for example, flow inside the heat transfer structure 42. This addresses the poor heat absorption efficiency of the working medium. Moreover, the working medium can be more effectively drawn by the pump 5, raising the working efficiency of the cold plate of the present disclosure. In addition, the cost of mold can be reduced. Different sizes of the guiding baffles 6 can also be used depending on the circumstances to remedy the tolerances issues that occurred in the casing 2 and the heat transfer structure 42 during production.

The above embodiments are set forth to illustrate the preferred embodiments of the present disclosure, and should not be construed as to limit the scope of the present disclosure in any way. Any modifications, changes or equivalents made to the above embodiments that are within the spirit disclosed by the present disclosure should be construed as encompassed by the inventive concept of the present disclosure.

What is claimed is:

1. A cold plate, comprising:
a casing;
a base combined with the casing to form a working space in which a working medium flows;
a heat transfer structure disposed on an inner side of the base for transferring thermal energy created by a heat source in contact with an outer side of the base to the working medium inside the working space via a path formed by the base and the heat transfer structure;
a pump disposed above the heat transfer structure for partitioning the working space into a heat absorption space and a drainage space and driving the working medium to flow from the heat absorption space to the drainage space; and
a flow guide structure disposed in the heat absorption space for guiding the working medium,
wherein the flow guide structure includes a guiding baffle formed with a top portion and two side walls extending perpendicularly from two ends of the top portion, and wherein an edge of the top portion facing the heat transfer structure has at least one guiding bevel,
wherein the flow guide structure further includes a stopper block for reducing a time that the working medium stays at edges of the heat absorption space,
wherein the guiding baffle is connected to the stopper block via at least one connecting portion, and the guiding baffle, the stopper block and the connecting portion are jointly to form an opening underneath the pump.

2. The cold plate of claim 1, further comprising a groove formed around a periphery of the heat transfer structure disposed on the inner side of the base for allowing the two side walls to wedge thereinto.

3. The cold plate of claim 2, wherein the groove has a positioning indentation, and one of the two side walls has a positioning protrusion to be wedged to the positioning indentation.

4. The cold plate of claim 3, wherein the positioning indentation and the positioning protrusion are arranged perpendicular to a flow direction of the working medium.

5. The cold plate of claim 1, wherein the stopper block includes a top piece and two side pillars perpendicularly extending from two ends of the top piece, and the two side pillars are wedged into the groove.

6. The cold plate of claim 5, wherein the groove has a positioning indentation, and one of the two side pillars has a positioning protrusion to be wedged to the positioning indentation.

7. The cold plate of claim 6, wherein the positioning indentation and the positioning protrusion are arranged perpendicular to a flow direction of the working medium.

8. The cold plate of claim 5, wherein sides of the top piece of the stopper block facing the inner side of the base and adjacent the heat transfer structure are formed with at least another one guiding bevel.

9. The cold plate of claim 1, wherein the guiding baffle, the stopper block and the connecting portion are integrally formed into one piece.

10. The cold plate of claim 1, wherein the edge of the top portion facing the heat transfer structure has at least one cut.

11. The cold plate of claim 1, wherein the flow guide structure is disposed above a portion of the heat transfer structure, and the pump is disposed above another portion of the heat transfer structure.

12. A cold plate, comprising:
a heat absorption space in which a working medium flows;
a heat transfer structure disposed on a base and in the heat absorption space for transferring thermal energy created by a heat source in contact with the base to the working medium; and
a flow guide structure disposed above a portion of the heat transfer structure and in the heat absorption space for guiding the working medium,
wherein the flow guide structure includes a guiding baffle including a top portion and two side walls extending perpendicularly from two ends of the top portion, and wherein an edge of the top portion facing the heat transfer structure has at least one guiding bevel,
wherein the flow guide structure further includes a stopper block,
wherein the guiding baffle is connected to the stopper block via at least one connecting portion, and the guiding baffle, the stopper block and the connecting portion are jointly to form with an opening.

13. The cold plate of claim 12, further comprising a groove formed around a periphery of the heat transfer structure.

14. The cold plate of claim 13, wherein the two side walls are wedged into the groove.

15. The cold plate of claim 14, wherein the stopper block including a top piece and two side pillars perpendicularly extending from two ends of the top piece, and the two side pillars are wedged into the groove.

16. The cold plate of claim 15, wherein the groove has a first positioning indentation for a first positioning protrusion of one of the two side walls to be wedged thereinto, and the groove has a second positioning indentation for a second positioning protrusion of one of the two side pillars to be wedged thereinto.

17. The cold plate of claim 16, wherein the first positioning indentation and the first positioning protrusion are arranged perpendicular to a flow direction of the working medium, and the second positioning indentation and the second positioning protrusion are arranged perpendicular to the flow direction of the working medium.

18. The cold plate of claim 15, wherein the top piece has a side that includes at least another one guiding bevel.

19. The cold plate of claim 12, wherein the guiding baffle, the stopper block and the connecting portion are integrally formed into one piece.

20. The cold plate of claim 14, wherein the edge of the top portion has at least one cut.

\* \* \* \* \*